(12) United States Patent
Foley

(10) Patent No.: US 8,779,834 B1
(45) Date of Patent: Jul. 15, 2014

(54) MULTI-LO BAND SWITCHED-CORE FREQUENCY MIXER

(75) Inventor: William T. Foley, North Chelmsford, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/589,399

(22) Filed: Aug. 20, 2012

(51) Int. Cl.
*G06F 7/44* (2006.01)
*G06G 7/16* (2006.01)

(52) U.S. Cl.
USPC .......................................... 327/356; 327/357

(58) Field of Classification Search
None
See application file for complete search history.

(56) References Cited

U.S. PATENT DOCUMENTS

| | | | |
|---|---|---|---|
| 5,153,469 A * | 10/1992 | Petted et al. | 327/113 |
| 5,438,693 A * | 8/1995 | Cox | 455/333 |
| 6,026,287 A * | 2/2000 | Puechberty et al. | 455/333 |
| 6,665,528 B2 | 12/2003 | McNamara | |
| 7,936,224 B2 * | 5/2011 | Zhan | 331/36 L |
| 2008/0020728 A1 * | 1/2008 | Zhuo et al. | 455/313 |
| 2008/0139149 A1 * | 6/2008 | Mu et al. | 455/200.1 |
| 2009/0268849 A1 * | 10/2009 | Mu et al. | 375/329 |
| 2009/0270062 A1 * | 10/2009 | Mu et al. | 455/323 |
| 2010/0171542 A1 * | 7/2010 | Dawe et al. | 327/355 |
| 2011/0248766 A1 * | 10/2011 | Buer | 327/356 |

* cited by examiner

*Primary Examiner* — Tuan T Lam
(74) *Attorney, Agent, or Firm* — Advent, LLP

(57) ABSTRACT

A frequency mixer is disclosed. In an implementation, the multi-LO band switched-core includes a single field-effect transistor (FET) ring having a first mixer core and a second mixer core. The first mixer core and the second mixer core configured to connect to a radio frequency (RF) port and an intermediate frequency (IF) port. The frequency mixer also includes a first local oscillator (LO) transformer and a second LO transformer. The first LO transformer is configured to furnish a first LO signal occurring in a first limited range of frequencies to the first mixer core, and the second LO transformer is configured to furnish a second LO signal occurring in a second limited range of frequencies to the second mixer core.

18 Claims, 3 Drawing Sheets

US 8,779,834 B1

MULTI-LO BAND SWITCHED-CORE FREQUENCY MIXER

BACKGROUND

It is often desirable to convert frequencies of a signal from a first frequency band to a second frequency band, especially in radio frequency (RF) systems, such as in cellular applications (e.g., cellular basestations). For example, frequency conversion is typically utilized to allow for the amplification, filtration, and data conversion of a received signal at a frequency other than the RF frequency. Thus, frequency mixers are typically utilized in these RF systems for frequency conversion. Frequency mixers include electrical circuits configured to create new frequencies from two signals applied to the frequency mixer. For example, frequency mixers may be utilized to shift signals from one frequency range to another (e.g., heterodyning the signals).

SUMMARY

A multi-LO band switched-core frequency mixer is disclosed that is configured to heterodyne a signal. In an implementation, the multi-LO band switched-core includes a single field-effect transistor (FET) ring having a first mixer core and a second mixer core. The first mixer core and the second mixer core configured to connect to a common radio frequency (RF) port and a common intermediate frequency (IF) port. The multi-LO band switched-core frequency mixer also includes a first local oscillator (LO) transformer connected to the single FET ring and a second LO transformer connected to the single FET ring. Thus, two separate (distinct) LO paths lead to the first and second LO transformers. The first LO path is configured to furnish an LO signal applied in a first limited range of frequencies to the first mixer core, and the second LO path is configured to furnish a second LO signal occurring in a second limited range of frequencies to the second mixer core. This may allow the frequency mixer to operate at two or more widely separated LO frequency bands of interest with optimum performance in each frequency band. The frequency mixer also includes LO select logic input (e.g., circuitry) configured to selectively activate a mixer LO path and mixer core of choice applicable to the intended LO frequency band of operation.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
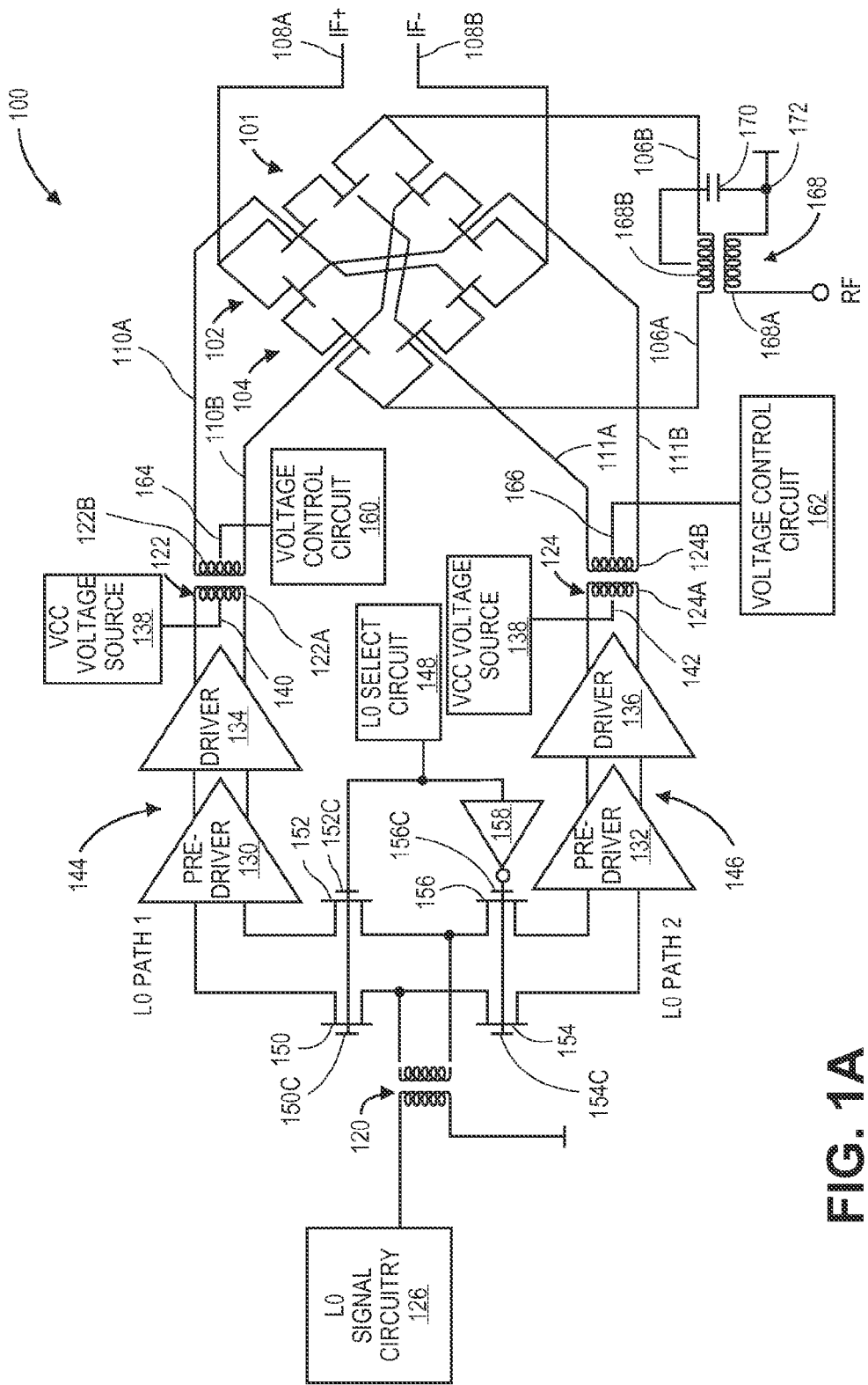
FIG. 1A is a schematic diagram illustrating a frequency mixer having a single quad field-effect transistor (FET) ring in accordance with an example implementation of the present disclosure, wherein the single FET ring includes a plurality of segments and each segment includes a plurality of transistors connected in series.

Mixer circuits are commonly used in a number of applications. For example, mixer circuits are often used in radio frequency (RF) applications for up-converting (up-mixing) or down-converting (down-mixing). In this context, up-converting is the process of mixing a base band signal or IF signal, such as a differential IF signal, with an LO signal, such as a differential LO signal, that is generated by a local oscillator circuit that operates in the RF range. This process generates a mixed RF signal with the IF information included with (mixed with) the LO signal generated by the local oscillator. Down-converting is the process of mixing an RF signal, such as a differential RF signal, with an LO signal, such as a differential LO signal, that is generated by a local oscillator circuit that operates in the RF range. This process generates a mixed IF (or baseband) signal with the RF information included with (e.g., mixed with) the LO signal generated by the local oscillator.

A typical type of mixer circuit includes a passive mixer circuit which may be implemented using complementary-metal-oxide semiconductor (CMOS) circuit fabrication processes. In such circuits, the operation of such mixer circuits is dependent on the linear range of those circuits. Thus, the linear range of the circuit affects the one decibel (1 dB) compression point and the third intercept point (IP3), which are measures of the adverse effects of non-linearities on the gain and performance of such circuits. In this respect, current approaches for implementing passive mixer circuits have certain limitations. These limitations include limited linear ranges which result in 1 dB compression points and IP3 points that are unacceptable for RF and IF signals with higher amplitudes (e.g. high signal swings).

Accordingly, a multi-LO band switched-core frequency mixer is disclosed that is configured to heterodyne a signal. The frequency mixer may extend the LO operating frequency band(s), while maintaining high linearity. In an implementation, the multi-LO band switched-core includes a single field-effect transistor (FET) ring having a first mixer core and a second mixer core. The first mixer core and the second mixer core configured to connect to a common radio frequency (RF) port and a common intermediate frequency (IF) port. For example, the single FET ring is comprised of a plurality of segments that include a plurality of transmission gates, such as transistors. Each transmission gate within each segment corresponds to a separate LO path. Thus, the number of transmission gates corresponds to the number of LO paths in the frequency mixer.

The multi-LO band switched-core frequency mixer also includes a first local oscillator (LO) balun connected to the single FET ring and a second LO balun connected to the single FET ring. The first LO balun is configured to furnish a first LO signal occurring in a first limited range of frequencies to the first mixer core, and the second LO balun is configured to furnish a second LO signal occurring in a second limited range of frequencies to the second mixer core. This frequency mixer core configuration may reduce setbacks related to attempting to use transmission gates to connect the transformers to a single mixer core. These setbacks may include, but are not limited to, LO signal loss, parasitic loading, narrow-banding of the LO signal, non-linearities, and overvoltage reliability issues. It is understood that this application may be extended such that the single FET ring may include N mixer cores, where N is the number of LO paths.

The multi-LO band switched-core frequency mixer may overcome relatively narrow frequency-band (+/−10% of LO frequency applied) operation of single core, single LO path mixers. The LO paths of a single mixer core may be considered narrowband due to inductance from the LO transformers and the mixer core capacitance that form a "tank-circuit" that exhibit "band-pass" frequency response. As a result, the LO frequencies may deviate more than +/−10% from the center frequency of the "tank-circuit," which may be filtered or attenuated to a point where there is insufficient drive to the core affecting the linearity of the mixer core.

Example Frequency Mixers

FIG. 1A illustrates a multi-LO band switched-core frequency mixer 100 in accordance with example implementations of the present disclosure. As shown, the multi-LO band switched-core frequency mixer 100 is a passive mixer configured to generate signals having new frequencies from a plurality of signals applied to the frequency mixer 100. For example, the mixer 100 may be configured to perform up-conversion to an input signal such that the frequency of the output signal is higher from the frequency of the input signal. In another example, the mixer 100 may be configured to perform down-conversion of the input signal such that the frequency of the output signal is lower from the frequency of the input signal. Up-conversion mixers are typically utilized in transmitters, and down-conversion mixers are typically utilized in receivers. For example, up-converting includes the process of mixing a base band signal or IF signal, such as a differential IF signal, with an LO signal, such as a differential LO signal, that is generated by a local oscillator circuit that operates in the RF range. In another example, down-converting is the process of mixing an RF signal, such as a differential RF signal, with an LO signal, such as a differential LO signal, that is generated by a local oscillator circuit that operates in the RF range.

As illustrated in FIG. 1A, the frequency mixer 100 illustrated includes a single quad field-effect transistor (FET) 101 having at least two mixer cores 102, 104. The FET ring 101 also includes a plurality of segments 103, which are described in greater detail below. The mixer cores 102, 104 are configured to couple to a set of common differential ports (e.g., terminals) 106, 108. As shown, the frequency mixer 100 includes differential radio frequency (RF) ports 106A (RF+), 106B (RF−) and differential intermediate frequency (IF) ports 108A (IF+), 108B (IF−). The frequency mixer 100 also includes local oscillator (LO) ports 110, 111 (110A [LO+], 110B [LO−], 111A [LO+], 111B [LO−]) that are configured to facilitate conversion of signals furnished to the mixer 100. As shown, the LO ports 110A, 110B are associated with the first mixer core 102, and the LO ports 111A, 111B are associated with the second mixer core 104. In an implementation, the LO ports 110A, 110B, 111A, 111B are utilized to furnish a differential LO signal to the gates of the respective transistors of the corresponding mixer cores 102, 104. The LO signal includes waveform characteristics occurring within the RF range. The RF ports 106A, 106B, the IF ports 108A, 108B, and the LO ports 110A, 110B are common to the first mixer core 102, and the RF ports 106A, 106B, the IF ports 108A, 108B, and the LO ports 111A, 111B are common to the second mixer core 104.

Figure 1B:
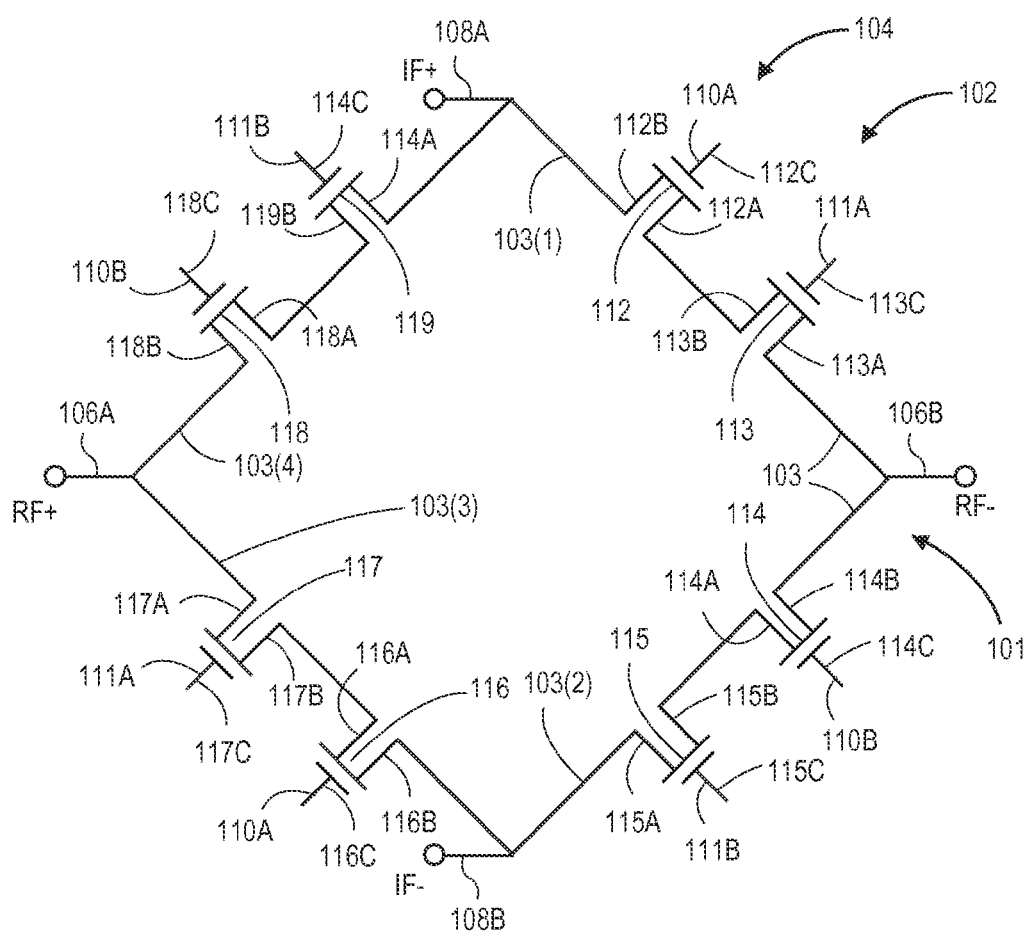
FIGS. 1B and 1C are circuit diagrams illustrating example implementations of the single FET ring shown in FIG. 1A, wherein the single FET ring includes a plurality of mixer cores.
Figure 1C:
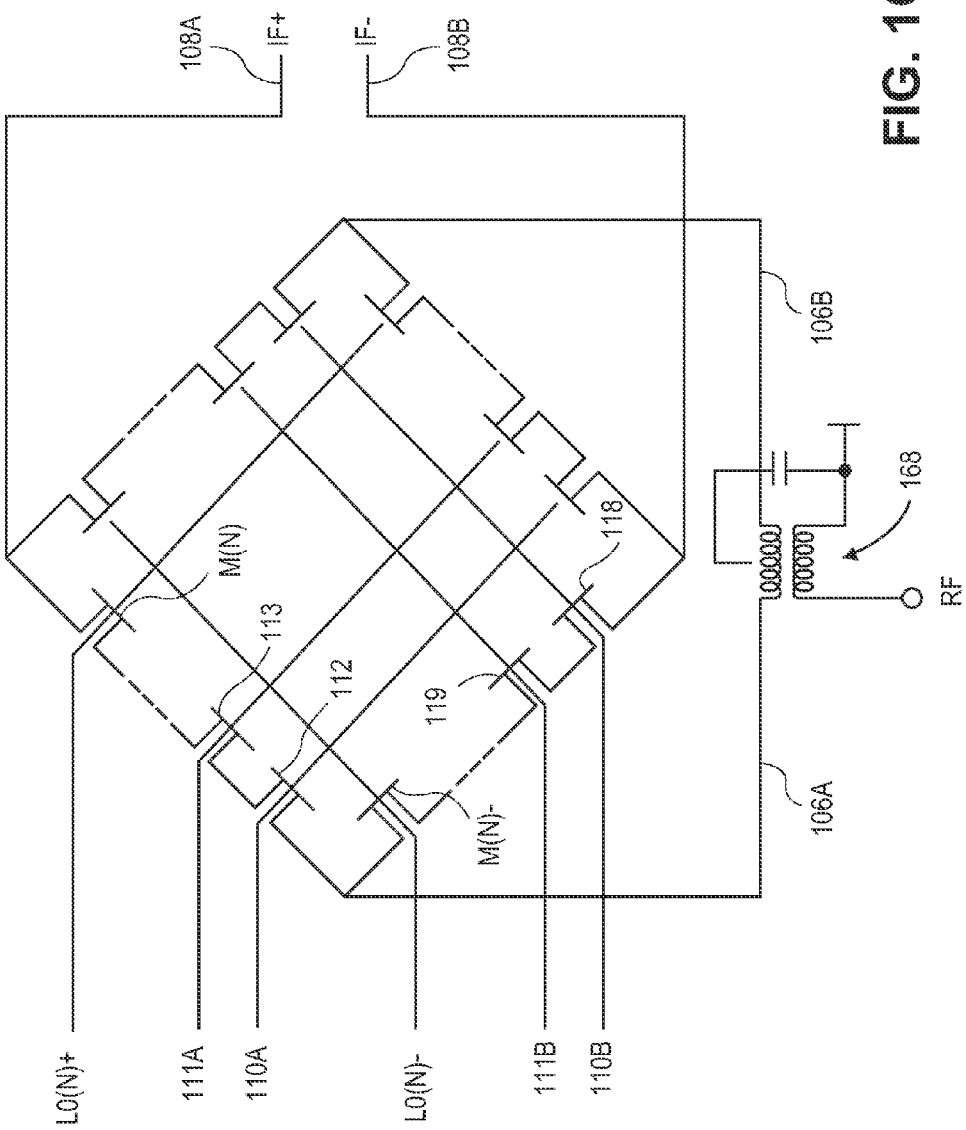

FIGS. 1B and 1C illustrate example implementations of mixer cores 102, 104. As described above, the single FET ring 101 includes mixer cores 102, 104. As described above, the single FET ring 101 includes a plurality of segments 103 (e.g., conductive paths, such as traces, wires, etc.). In a specific implementation, as shown in FIG. 1B, the mixer core 102 comprises transmission gates 112, 114, 116, 118, and the mixer core 104 comprises transmission gates 113, 115, 117, 119. Each segment 103(1), 103(2), 103(3), 103(4) includes at least one transmission gate from each mixer core 102, 104. For example, the segment 103(1) includes the transmission gate 112 and the transmission gate 113 connected in series; the segment 103(2) includes the transmission gate 114 and the transmission gate 115 connected in series; the segment 103(3) includes the transmission gate 116 and the transmission gate 117 connected in series; and the segment 103(4) includes the transmission gate 118 and the transmission gate 119 connected in series. Thus, each transmission gate within a single segment 103 (e.g., transmission gates 112, 113 of the segment 103(1)) is associated with a distinct LO path, which is described in greater detail below.

In one or more implementations, the transmission gates 112, 113, 114, 115, 116, 117, 118, 119 may be metal-oxide-semiconductor field-effect transistors (MOSFETs). For example, each transmission gate (transistor) 112, 113, 114, 115, 116, 117, 118, 119 may be an n-type MOSFET device. In another example, each transistor 112, 113, 114, 115, 116, 117, 118, 119 may be a p-type MOSFET device. The transistors 112, 113, 114, 115, 116, 117, 118, 119 each include a source contact (e.g., an electrode), a drain contact, and a gate contact, which provide an electrical connection to the respective regions (e.g., source region, drain region, gate) of each transistor. Thus, as shown in FIG. 1B, the transistor 112 includes a source contact 112A, a drain contact 112B, and a gate contact 112C; the transistor 113 includes a source contact 113A, a drain contact 113B, and a gate contact 113C; the transistor 114 includes a source contact 114A, a drain contact 114B, and a gate contact 114C; the transistor 115 includes a source contact 115A, a drain contact 115B, and a gate contact 115C; the transistor 116 includes a source contact 116A, a drain contact 116B, and a gate contact 116C; the transistor 117 includes a source contact 117A, a drain contact 117B, and a gate contact 117C; the transistor 118 includes a source contact 118A, a drain contact 118B, and a gate contact 118C; and the transistor 119 includes a source contact 119A, a drain contact 119B, and a gate contact 119C. The transistors 112, 113, 114, 115, 116, 117, 118, 119 each have an open configuration (e.g., open circuit to prevent current flow) and a closed configuration (e.g., closed circuit to allow current flow).

For the purposes of the present disclosure, source and drain contacts are described using the reference numbers 112A, 112B, 113A, 113B, 114A, 114B, 115A, 115B 116A, 116B, 117A, 117B, 118A, 118B, 119A, 119B. While these example source and drain contacts are shown in a specific configuration, it will be appreciated that other configurations may be used (e.g., configurations where one or more source and drain regions are interchangeable in implementations of the frequency mixer 100). In a specific implementation of the frequency mixer 100, as shown in FIG. 1B, the drain contact 112B of the transistor 112 and the drain contact 119A of the transistor 119 are communicatively connected together via an electrical connection (e.g., a wire trace, and so forth), which is connected to the RF port 106A (RF+). The source contact 112A of the transistor 112 and the drain contact 113B of the transistor 113 are communicatively connected together in series via an electrical connection. The source contact 113A of the transistor 113 and the drain contact 114B of the transistor 114 are communicatively connected together via an electrical connection, which is connected to the IF port 108A (IF+). The source contact 114A of the transistor 114 and the drain contact 115B of the transistor 115 are communicatively connected together in series via an electrical connection. The source contact 115A of the transistor 115 and the drain contact 116B are communicatively connected together via an electrical connection, which is connected to the RF port 106B (RF−). The source contact 116A of the transistor 116 and the drain contact 117B of the transistor 117 are communicatively connected together in series via an electrical connection. The source contact 117A of the transistor 117 and the drain contact 118B of the transistor 118 are communicatively connected together via an electrical connection, which is connected to the IF port 108B (IF−). The source contact 118A of the transistor 118 and the drain contact 119B of the transistor 119 are communicatively connected together via an electrical connection.

As shown in FIG. 1B, the gate contacts 112C, 116C are each communicatively connected to the LO port 110A (LO+) of the first mixer core 102. The gate contacts 114C, 118C are communicatively connected to the LO port 110B (LO−) of the first mixer core 102. The gate contacts 113C, 117C are communicatively connected to the LO port 111A (LO+) of the second mixer core 104. The gate contacts 115C, 119C are communicatively connected to the LO port 111B (LO−) of the second mixer core 104.

In an implementation, when the alternating current (AC) voltage at the LO port 110A furnishes a sufficient voltage to the respective gate contacts 112C, 116C, the respective transistors 112, 116 transition from the open configuration to the closed configuration to allow for current flow and transistors 114, 118 (driven from LO port 110B) transition from the closed configuration to the open configuration due to the differential nature of the LO signal. The LO port 111A furnishes a sufficient direct current (DC) signal (voltage) to the gate contacts 113C, 117C, of the respective transistors 113, 117 such that the transistors 113, 117 function as a pass-thru switch (e.g., respective transistors transition from the open configuration to the closed configuration to at least substantially pass the signal when a sufficient DC signal is applied to the transistor gates). In an implementation, the DC signal may comprise the DC supply voltage (e.g., $V_{CC}$). However, it is understood that other DC voltage levels may be utilized in accordance with the requirements of the frequency mixer 100.

While the transistors 112, 116 of the first mixer core 102 are in the closed configuration, and the transistors 113, 117 of the second mixer core 104 are functioning as pass-thru switches, the RF port 106B (RF−) is communicatively connected to the IF port 108B (IF−). Additionally, while the transistors 112, 116 are in the closed configuration, and the transistors 113, 117 of the second mixer core 104 are functioning as pass-thru switches, the RF port 106A (RF+) is also communicatively connected to the IF port 108A (IF+). Thus, the signal present at the RF port 106B may pass through to the IF port 108B, and vice versa. Additionally, the signal present at the RF port 106A may pass through to the IF port 108A, and vice versa. During this portion of the LO cycle, the transistors 114, 118 are in the open configuration. Thus, when the LO AC voltage inverts, the LO port 110B furnishes a sufficient voltage to the gate contacts 114C, 118C such that the respective transistors 114, 118 transition from the open configuration to the closed configuration to allow for current flow. The LO port 111B also furnishes a DC signal (e.g., $V_{CC}$) to the gates 115C, 119C of the transistors 115, 119 such that the transistors 115, 119 are in the closed configuration to function as pass-thru switches. While the transistors 114, 118 are in the closed configuration (and the transistors 113, 117 of the second mixer core 104 are functioning as pass-thru switches), the RF port 106B (RF−) is communicatively connected to the IF port 108A (IF+). Additionally, while the transistors 114, 118 are in the closed configuration (and the transistors 115, 119 of the second mixer core 104 are functioning as pass-thru switches), the RF port 106A (RF+) is communicatively connected to the IF port 108B (IF−). Thus, the signal present at the RF port 106A may pass through to the IF port 108B, and vice versa. The signal present at the RF port 106B may pass through to the IF port 108A, and vice versa. During this portion of the LO cycle, the transistors 112, 116 of the first mixer core 102 are in the open configuration. Thus, the differential AC signal at the LO ports 110, 111 commutates the connections between the differential RF and IF ports (e.g., ports 106A, 106B, 108A, 108B).

As shown in FIG. 1A, the frequency mixer 100 includes a balanced-unbalanced device (balun) 120 and two transformers (XFMR) 122, 124. In an implementation, the balun 120 and the transformers 122, 124 are coupled to various ports and/or circuitry configured to facilitate transmission of various RF signals (e.g., differential LO signals, differential RF signals). In a specific implementation, the transformers 122, 124 may comprise varied ratios in accordance with the frequency mixer requirements, where the ratio comprises the ratio of the number of turns in the secondary winding to the number of turns in the primary winding. For example, the transformers 122, 124 may comprise baluns in some implementations. As shown in FIG. 1A, the first balun 120 is coupled to a LO signal circuit 126 that is configured to furnish the LO signal. In implementations, the LO signal is a radio frequency (RF) signal communicated to the first balun 120 via the LO signal circuit 126. As shown, the first balun 120 is coupled to a first pre-driver 130 and a second pre-driver 132. The first pre-driver 130 is connected to a first driver 134, and the second pre-driver 132 is connected to a second driver 136. As shown, the first driver 134 is connected to the second balun 122, and the second driver is connected to the third balun 124. The pre-drivers 130, 132 are configured to amplify the LO signal, which is then furnished to the respective drivers 134, 136. The drivers 134, 136 are configured to further amplify the LO signal before furnishing to the respective transformers 122, 124

The second transformer 122 and the third transformer 124 are connected to a $V_{CC}$ voltage source 138 via respective center taps 140, 142 at the primary winding portion 122A, 124A of the transformer 122, 124 (see FIG. 1A). In an implementation, the $V_{CC}$ voltage source 138 is a DC bias utilized to furnish a DC voltage to bias (and at least partially power) the respective drivers 134, 136 (e.g., the center tap 140 is associated with the first driver 134; the center tap 142 is associated with the second driver 136). For example, the $V_{CC}$ voltage source 138 is configured to furnish a DC voltage to the primary winding portion 122A of the transformer 122, and the $V_{CC}$ voltage source 134 is configured to furnish a DC voltage to the primary winding portion 124A of the transformer 124.

In one or more implementations, the mixer 100 allows operation in two or more separate widely-spaced LO frequency bands. In accordance with the present disclosure, the mixer 100 may include multiple LO paths. For example, the mixer 100 may include a first LO path 144 that includes the first pre-driver 130, the first driver 134, the second balun 122. The second balun 122 is then connected, via the respective LO ports 110A, 110B, to the gates 112C, 114C, 116C, 118C of the transistors 112, 114, 116, 118 (transistors that comprise the first mixer core 102). The mixer 100 may also include a second LO path 144 that includes the second pre-driver 132, the second driver 136, and the third balun 124. The third balun 124 is then connected, via the respective LO ports 111A, 111B, to the gates 113C, 115C, 117C, 119C of the transistors 113, 115, 117, 119 (transistors that comprise the second mixer core 104).

The frequency mixer LO path is configurable by way of the logic input to the LO select circuit 148 to choose the LO path appropriate for the LO frequency generated by LO signal circuit 126. The frequency mixer 100 shown in FIG. 1A offers two distinct LO frequency bands where the mixer performance is optimized as compared to a conventional single LO path mixer that offers a single optimized LO frequency band.

In an implementation, the mixer 100 includes LO select circuitry 148 configured to selectively activate/deactivate (e.g., enable/disable) either or both LO paths 144, 146. For example, when the LO signal is occurring in the first frequency band, the LO select circuitry 148 is configured to activate the first LO path 144 and deactivate the second LO path 146. When the LO signal is occurring in the second frequency band, the LO select circuitry 148 is configured to activate the second LO path 146 and deactivate the first LO path 144. As shown, the mixer may further include a plurality of transmission gates 150, 152, 154, 156, which are associated with the LO paths 144, 146 and configured to at least substantially allow the LO signal to pass when the transmission gates 150, 152, 154, 156 are in the closed configuration and at least substantially prevent transmission of the LO signal when the transmission gates 150, 152, 154, 156 are in the open configuration. In an implementation, the transmission gates 150, 152, 154, 156 comprise MOSFET devices. The transmission gates 150, 152 are associated with the first LO path 144 and are configured to control transmission (e.g., passage) of the LO signal to the first LO path 144. The transmission gates 154, 156 are associated with the second LO path 146 and are configured to control transmission (e.g., passage) of the LO signal to the first LO path 146. As shown, the LO select circuitry 148 is directly connected to the gates 150C, 152C of the transmission gates 150, 152 and connected to the gates 154C, 156C of the transmission gates 154, 156 by way of inverter circuitry 158. In an implementation, the transmission gates 150, 152, 154, 156 may comprise n-type MOSFETs. Thus, in this implementation, when the LO select circuitry 148 furnishes a logic zero ("0") voltage signal, the LO signal is furnished to the second LO path 146 by way of the transmission gates 154, 156 that are in the closed configuration due to the inversion of the logic zero voltage signal at the respective transistor gates. When the LO select circuitry 148 furnishes a logic one ("1") voltage signal (e.g., a $V_{CC}$ voltage signal, etc.), the LO signal is furnished to the first LO path 144 by way of the transmission gates 150, 152 that are in the closed configuration due to the logic one voltage signal at the respective transistor gates.

As shown in FIG. 1A, the secondary windings 122B, 124B of the second transformer 122 and the third transformer 124 are connected to respective voltage control circuitry 160, 162 via respective center taps 164, 166. The voltage control circuitry 160, 162 are configured to furnish a voltage signal of varying values depending upon which LO path 144, 146 is active. For ease of understanding the operation of the present disclosure, it is assumed the LO select circuitry 148 is configured to furnish a logic one voltage signal to enable LO path 144 and disable LO path 146 and to furnish a logic zero to enable LO path 146 and disable the LO path 144. In an implementation, the voltage control circuitry 160 is configured to furnish a voltage signal at least approximately equal to a threshold voltage ($V_T$) (of the transistors included in the FET ring 101) above the IF port 108 DC voltage when the LO select circuitry 148 furnishes a logic one voltage signal to furnish a DC bias voltage at least approximately equal to the supply voltage (e.g., $V_{CC}$) when the LO select circuitry 148 furnishes a logic zero voltage signal. The threshold voltage above the IF port DC voltage may serve to provide a higher instantaneous gate overdrive under normal commutating operations. Additionally, the DC bias voltage (e.g., at least approximately full DC supply voltage) applied to the gates associated with the inactive LO path may ensure high linearity and low loss to the signal (e.g., insertion loss). Thus, when the LO signal is furnished to the first LO path 144, the voltage control circuitry 160 is configured to furnish a voltage signal to bias the LO signal, and when the LO signal is furnished to the second LO path 146, the voltage control circuitry 160 is configured to furnish a DC voltage signal to cause the transistors 112, 114, 116, 118 to transition from the open configuration to the closed configuration (e.g., cause the transistors 112, 114, 116, 118 to function as pass-thru switches).

In another implementation, the voltage control circuitry 162 is configured to furnish a voltage signal at least approximately equal to a threshold voltage ($V_T$) above the IF port 108 DC voltage when the LO select circuitry 148 furnishes a logic zero voltage signal and to furnish a DC bias voltage at least approximately equal to the supply voltage (e.g., $V_{CC}$) when the LO select circuitry 148 furnishes a logic one voltage signal.

Thus, when the LO signal is furnished second LO path 146, the voltage control circuitry 162 is configured to furnish a voltage signal to bias the LO signal, and when the LO signal is furnished to the second LO path 146, the voltage control circuitry 162 is configured to furnish a DC voltage signal at least approximately equal to the supply voltage (e.g., $V_{CC}$) to cause the transistors 113, 115, 117, 119 to transition from the open configuration to the closed configuration (e.g., cause the transistors 113, 115, 117, 119 to function as pass-thru switches). Thus, the transistors 112, 114, 116, 118 of the first mixer core 102 are configured to commutate an RF signal and the transistors 113, 115, 117, 119 of the second mixer core 104 function as pass-thru switches (e.g., LO signal occurring within the first frequency band is furnished to the first LO path 144). Likewise, the transistors 113, 115, 117, 119 of the second mixer core 104 are configured to commutate an RF signal and the transistors 112, 114, 116, 118 of the first mixer core 102 function as pass-thru switches (e.g., LO signal occurring within the second frequency band is furnished to the second LO path 146).

As shown in FIG. 1C, the number of mixer cores may be extended by N, where N is the number of LO paths. Thus, each segment 103 of the single FET ring 101 includes N transmission gates (e.g., MOSFET devices) connected in series. For ease of reference, M(N)+ represents the $N^{th}$ transmission gate associated with the $N^{th}$ LO positive terminal (LO(N)+), and M(N)− represents the $N^{th}$ transmission gate associated with the $N^{th}$ LO negative terminal. Similar to the configurations described above, each transmission gate within a single segment 103 is associated with a distinct LO path and that transmission gate is configured to commutate the signal while the remaining transmission gates within the single segment 103 are configured to function as pass-thru switches. The number of LO paths may be dictated, in part, by insertion loss with each additional transmission gate introduced in the respective mixer core, as well as the die area required by transformers in each additional LO path.

As shown in FIG. 1A, the frequency mixer 100 may also include an RF balun 168. The RF balun 168 is configured to facilitate transmission of the RF signal to the RF ports 106A, 106B. A passive storage component 170 may be connected to RF balun 168. For example, the passive storage component 170 is connected between node 172 (node defined between the primary RF balun winding 168A and electrical ground) and the secondary RF balun winding 168B. As shown, the passive storage component 170 is center tapped to the secondary RF balun winding 168B. In one or more implementations, the passive storage component 170 comprises a capacitor. The passive storage component 170 serves to provide RF bypassing or DC decoupling.

In another implementation, the frequency mixer core 100 may utilized in dynamically switched time-division duplex (TDD) configurations. For example, the first LO path 144 may furnish a first LO signal applied in a first limited range of frequencies to the first mixer core 102 during a first time interval, and the second LO path 146 may furnish a second LO signal applied in a second limited range of frequencies (e.g., a range different from the first limited range of frequencies) to the second mixer core 104 during a second time interval (e.g., a time interval different from the first time interval).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A frequency mixer comprising:
a single field-effect transistor (FET) ring comprising a first mixer core and a second mixer core, the first mixer core and the second mixer core configured to connect to a radio frequency (RF) port and an intermediate frequency (IF) port;
a first local oscillator (LO) transformer connected to the single FET ring, the first LO transformer configured to furnish a first LO signal occurring in a first limited range of frequencies to the first mixer core;
a second LO transformer connected to the single FET ring, the second LO transformer configured to furnish a second LO signal occurring in a second limited range of frequencies to the second mixer core, the first limited range of frequencies different than the second limited range of frequencies,
a first driver coupled to the first LO transformer, the first driver configured to amplify the first LO signal during a first time interval; and
a second driver coupled to the second LO transformer, the second driver configured to amplify the second LO signal during a second time interval
wherein the first LO signal is configured to cause the first mixer core to commutate a frequency mixer signal during the first time interval and the second LO signal is configured to cause the second mixer core to commutate the frequency mixer signal during the second time interval, the second time interval different than the first time interval.

2. The frequency mixer as recited in claim 1, wherein the second mixer core is configured to at least substantially pass-thru the signal during the first time interval and the first mixer core is configured to at least substantially pass-thru the signal during the second time interval.

3. The frequency mixer as recited in claim 1, wherein the single FET ring includes a plurality of segments, each one of the plurality of segments including at least a first transistor and a second transistor, the first transistor defining the first mixer core and the second transistor defining the second mixer core.

4. The frequency mixer as recited in claim 3, wherein at least one of the first transistor or the second transistor comprise a metal-oxide-semiconductor field-effect transistor (MOSFET) device.

5. The frequency mixer as recited in claim 4, wherein at least one of the first transistor and the second transistor comprise an n-type MOSFET device.

6. The frequency mixer as recited in claim 3, further comprising a first LO path for transmitting the first LO signal during the first time interval; and a second LO path for transmitting the second LO signal during the second time interval, wherein the first transistor is connected to a first LO path and the second transistor is connected to a second LO path.

7. The frequency mixer as recited in claim 6, further comprising LO select circuitry for selectively activating the first LO path during the first time interval and selectively activating the second LO path during the second time interval.

8. A frequency mixer comprising:
a first local oscillator (LO) transformer configured to furnish a first LO signal occurring in a first limited range of frequencies to a first mixer core;
a second LO transformer configured to furnish a second LO signal occurring in a second limited range of frequencies to a second mixer core, the first limited range of frequencies different than the second limited range of frequencies; and
a field-effect transistor (FET) ring configured to connect to a radio frequency (RF) port and an intermediate frequency (IF) port, the FET ring comprising a plurality of segments configured to modify a frequency mixer signal, each one of the plurality of segments comprising at least two transistors including a first transistor having a first gate and a second transistor having a second gate; a first driver coupled to the first LO transformer, the first driver configured to amplify the first LO signal during a first time interval; and a second driver coupled to the second LO transformer, the second driver configured to amplify the second LO signal during a second time interval;
wherein the first LO transformer is connected to the first gate of the first transistor and the second LO transformer is connected to the second gate of the second transistor, the first LO signal is configured to cause the first transistor to commutate a signal during the first time interval and the second LO signal is configured to cause the second transistor to commutate the signal during the second time interval, wherein the first time interval is different from the second time interval.

9. The frequency mixer as recited in claim 8, wherein the second transistor is configured to at least substantially pass-thru the signal during the first time interval and the first transistor is configured to at least substantially pass-thru the signal during the second time interval.

10. The frequency mixer as recited in claim 8, wherein the first transistor defines the first mixer core and the second transistor defines the second mixer core.

11. The frequency mixer as recited in claim 8, wherein at least one of the first transistor or the second transistor comprise a metal-oxide-semiconductor field-effect transistor (MOSFET) device.

12. The frequency mixer as recited in claim 11, wherein at least one of the first transistor and the second transistor comprise an n-type MOSFET device.

13. The frequency mixer as recited in claim 8, further comprising a first LO path for transmitting the first LO signal during the first time interval; and a second LO path for transmitting the second LO signal during the second time interval, wherein the first transistor is connected to a first LO path and the second transistor is connected to a second LO path.

14. The frequency mixer as recited in claim 13, further comprising LO select circuitry for selectively activating the first LO path during the first time interval and selectively activating the second LO path during the second time interval.

15. A frequency mixer comprising:
- a field-effect transistor (FET) ring configured to connect to a radio frequency (RF) port and an intermediate frequency (IF) port, the FET ring comprising a plurality of segments configured to modify a frequency mixer signal, each one of the plurality of segments comprising at least three transistors including a first transistor having a first gate, a second transistor having a second gate, and a third transistor having a third gate,
- wherein the first gate is configured to connect to a first LO transformer to receive a first LO signal having a first limited range of frequencies, the second gate is configured to connect to a second LO transformer to receive a second LO signal having a second limited range of frequencies, the third gate is configured to connect to a third LO transformer to receive a third LO signal having a first limited range of frequencies, the first LO signal is configured to cause the first transistor to commutate the frequency mixer signal, the second LO signal is configured to cause the second transistor to commutate the frequency mixer signal, and the third LO signal is configured to cause the third transistor to commutate the frequency mixer signal.

16. The frequency mixer as recited in claim 15, wherein the first transistor defines a first mixer core, the second transistor defines a second mixer core, and the third transistor defines a third mixer core.

17. The frequency mixer as recited in claim 15, wherein at least one of the first transistor, the second transistor, or the third transistor comprise a metal-oxide-semiconductor field-effect transistor (MOSFET) device.

18. The frequency mixer as recited in claim 17, wherein the MOSFET device comprises an n-type MOSFET device.

* * * * *